(12) United States Patent
Becker

(10) Patent No.: US 12,101,389 B2
(45) Date of Patent: Sep. 24, 2024

(54) METHOD AND APPARATUS FOR SYNCHRONIZING FREQUENCY IN REMOTE TERMINALS

(71) Applicant: Hughes Network Systems, Germantown, MD (US)

(72) Inventor: Neal David Becker, Frederick, MD (US)

(*) Notice: Subject to any disclaimer, the term of this patent is extended or adjusted under 35 U.S.C. 154(b) by 35 days.

(21) Appl. No.: 17/812,926

(22) Filed: Jul. 15, 2022

(65) Prior Publication Data

US 2024/0022390 A1    Jan. 18, 2024

(51) Int. Cl.
*H04L 7/00* (2006.01)
*H03L 7/099* (2006.01)

(52) U.S. Cl.
CPC .......... *H04L 7/0025* (2013.01); *H03L 7/0991* (2013.01)

(58) Field of Classification Search
CPC .................... H03L 7/0991; H04L 7/0025
See application file for complete search history.

(56) References Cited

U.S. PATENT DOCUMENTS

| | | | |
|---|---|---|---|
| 6,366,628 B1 | 4/2002 | Su et al. | |
| 7,424,069 B1* | 9/2008 | Nicholls | H03L 7/14 375/339 |
| 8,331,519 B2* | 12/2012 | Zhidkov | H03L 7/091 375/357 |
| 9,337,934 B1* | 5/2016 | Agazzi | H04B 10/61 |
| 2006/0023332 A1* | 2/2006 | Giovenzana | H04L 7/10 360/65 |
| 2008/0056403 A1 | 3/2008 | Wilson | |
| 2018/0366155 A1 | 12/2018 | Bellorado et al. | |
| 2019/0081772 A1 | 3/2019 | Gao et al. | |
| 2022/0038103 A1* | 2/2022 | Sandberg | H03M 1/0624 |
| 2022/0263512 A1* | 8/2022 | Périn | H03L 7/102 |

FOREIGN PATENT DOCUMENTS

WO    03047089 A1    6/2003

OTHER PUBLICATIONS

International Search Report for PCT Application No. PCT/US2023/068657.

* cited by examiner

*Primary Examiner* — David B Lugo
(74) *Attorney, Agent, or Firm* — Capitol City TechLaw; Jasbir Singh

(57) ABSTRACT

An apparatus for synchronizing frequency to a symbol timing, the apparatus including: a master oscillator to generate a master clock signal; an interpolator to accumulate a frequency error estimate between a symbol timing frequency and the master clock signal; and a frequency controller to transfer a portion of the frequency error estimate to the master oscillator to obtain a lock between the symbol timing and the master clock signal of the master oscillator in a manner that zeros-out the frequency error estimate.

14 Claims, 4 Drawing Sheets

METHOD AND APPARATUS FOR SYNCHRONIZING FREQUENCY IN REMOTE TERMINALS

BACKGROUND

Communication systems commonly take the form of hub and spokes where a central hub communicates with remote terminals. Examples include satellite communications systems with a hub and VSATs (Very Small Aperture Terminals), and in terrestrial networks a GNB (Ground NodeB) and user terminals. To minimize the cost of the user terminals, it is common to employ low-cost oscillators as a frequency reference. At high frequencies there can be large frequency errors when a low-cost oscillator is used as frequency errors scale with the transmit frequency. In many communication systems, the frequency is corrected by the terminal before they transmit. If this was not done the frequency error can cause miss detection or interference in the VSAT example. Similarly, in terrestrial systems which are often OFDM (Orthogonal Frequency Division Multiplexing) based, frequency accuracy is critical to orthogonality of the channels. In the past different techniques have been used to synchronize the oscillator at the remote terminal using a signal from the hub as a frequency reference. The present teachings synchronize to a symbol timing rather than to a phase of a received signal.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

An apparatus for synchronizing frequency to a symbol timing is disclosed. The apparatus including: a master oscillator to generate a master clock signal; an accumulator to accumulate a frequency error estimate between a symbol timing frequency and the master clock signal; and a frequency controller to transfer a portion of the frequency error estimate to the master oscillator to obtain a lock between the symbol timing and the master clock signal of the master oscillator in a manner that zeros-out the frequency error. In the apparatus the master oscillator may include a Voltage Controlled Crystal Oscillator (VCXO) to control a sampling of the input signal by an Analog-to-Digital-Converter (A/D). In some embodiments, for example, in a purely digital implementation, the master oscillator may include a Numerically Controlled Oscillator (NCO) that modifies input sampling via a sample interpolator. The apparatus may include a phase lock loop comprising an inner loop comprising a second order loop, wherein an output of the second order loop controls an interpolator. The apparatus may include a phase lock loop comprising an outer loop comprising a single integrator. The apparatus may include a phase lock loop comprising an outer loop driven by the frequency error estimate. The apparatus may include a phase lock loop comprising an outer loop that is started during a signal acquisition of a received signal. The apparatus where the portion of the frequency error estimate transferred to the master oscillator is subtracted from the frequency error estimate. The apparatus where the interpolator periodically samples the symbol timing frequency with a periodicity. The apparatus where the interpolator periodically samples the symbol timing frequency with a periodicity greater than 50 symbols and less than 1000 symbols.

Additional features will be set forth in the description that follows, and in part will be apparent from the description, or may be learned by practice of what is described.

DRAWINGS

In order to describe the manner in which the above-recited and other advantages and features may be obtained, a more particular description is provided below and will be rendered by reference to specific embodiments thereof which are illustrated in the appended drawings. Understanding that these drawings depict only typical embodiments and are not, therefore, to be limiting of its scope, implementations will be described and explained with additional specificity and detail with the accompanying drawings.

Figure 1:
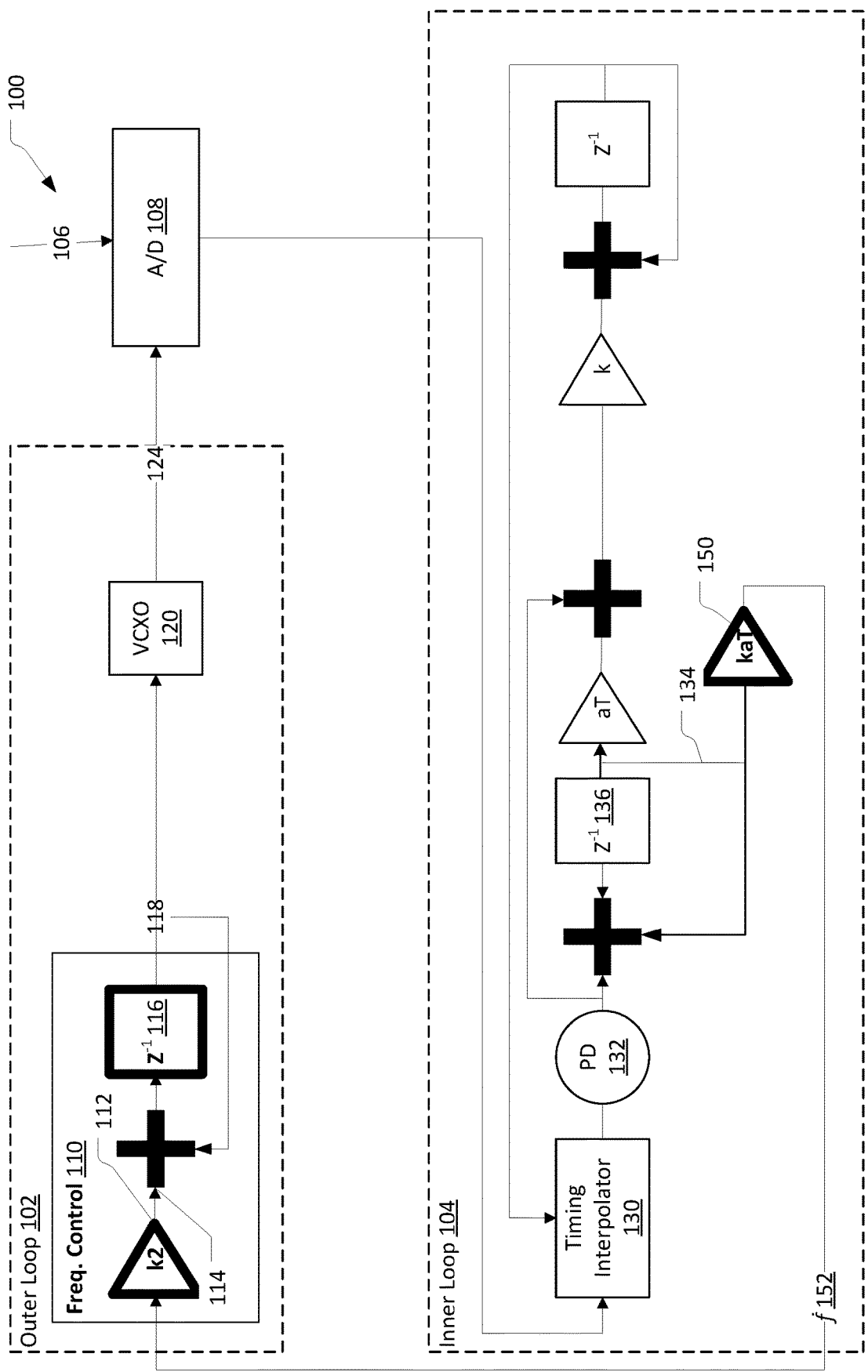
FIG. 1 illustrates a block diagram of a frequency corrector according to various embodiments.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The present teachings may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

FIG. 1 illustrates a block diagram of a frequency corrector according to various embodiments.

To help understand FIG. 1, the notation $z^{-1}$ denotes a unit (1 sample) delay, illustrated within a delay element 116, as is commonly denoted in the field of digital signal processing. The grouping of the delay element 116 with an adder 114 in a feedback loop as shown implements an accumulator, which performs a summation of the input samples. The present teachings disclose an apparatus 100. The apparatus 100 includes control loops, namely an inner loop 104 and an outer loop 102. The outer loop 102 includes a frequency control and a master oscillator 120 to generate a master oscillator output 124. The master oscillator output 124 is synchronized with a symbol timing frequency 106. The apparatus 100 may control the master oscillator 120 according to the symbol timing frequency 106 as received by the terminal. Together the outer loop 102 and the inner loop 104 control and adjust the master oscillator output 124 according to synchronize with a symbol timing frequency 106 received by the apparatus 100, such as, a terminal. The master oscillator 120 may be a VCXO (Voltage-Controlled Crystal Oscillator) or a NCO (Numerically Controlled Oscillator). The master oscillator 120 may be controlled with a frequency control signal 118. The master oscillator output 124 of the master oscillator 120 (or NCO) controls the sample timing phase of the incoming signal 106 either by adjusting the A/D clock in the case of an analog signal input (in which case block 108 is an analog-to-digital converter) or by using a digital interpolator in the case of where incoming signal 106 is a digital signal (in which case block 108 is a digital interpolator).

The inner loop 104 includes a symbol timing recovery loop, indicated in FIG. 1 as Inner Loop 104, for example, a symbol timing recovery loop of a demodulator of a terminal. For a continuous mode signal (included for example in the symbol timing frequency 106), a symbol timing recovery loop of a demodulator of the terminal may be implemented as a PLL (phase-locked-loop) typically as a 2nd-order PLL. The PLL gives fast acquisition over a wide range of frequency offset. The 2nd-order PLL cannot be used directly as a frequency control of high accuracy because there is essentially no filtering from the noisy signal input to the frequency control.

The symbol timing recovery loop may be implemented using digital signal processing including a timing interpolator 130 and a phase error detector 132. Following the phase error detector 132, which might be a Gardner error detector, the loop filter may be implemented. An example of a loop filter for a $2^{nd}$ order loop is shown in FIG. 1. The output of this loop filter controls the timing interpolator 130 which adjusts the symbol timing. The output of timing interpolator 130 may be sent to the rest of the demodulator, which is not shown.

For a 2nd-order PLL the loop filter includes two paths. A first path is strictly an integration of the phase error by an integrator 136 that outputs a frequency error estimate 134 as a steady state. A second path bypasses the integration. The first path, through the integrator 136, is relatively noise free due to a low-pass filter response (6 dB/octave) of the integrator 136 and provides a good frequency error estimate 134. The frequency error estimate 134 cannot be used by the inner loop 104 alone because such a loop would not be stable (the 2nd order loop has 1 pole and 1 zero). However, the frequency error estimate 134 can be passed to the outer loop 102 for correction via a scaler (gain adjustment) 150.

In the present teachings, the inner loop 104 attempts to lock to the symbol timing frequency as usual for a symbol timing recovery loop. Periodically, the frequency error estimated at the scaler 150 in the inner loop 104 may be sampled and a portion of it (here some k2) is transferred to the outer loop 102. The outer loop 102 may include a frequency control 110. The frequency control 110 may a simple 1st order loop including the scaler (gain adjustment) 112 and the delay element 116, for example, a single integrator. The scaler 112 may provide some gain k2<<1, so that at each periodic sampling a portion k2 of an estimated frequency error 152 ($\hat{f}$) is transferred from the inner loop 104 to the outer loop 102. To prevent a transient error response when this occurs, a corresponding correction is made to the inner loop 104. For example, if the inner loop 104 frequency error 152 ($\hat{f}$) estimate is f and the portion kf is transferred to the outer loop 102, the inner loop 104 frequency error 152 ($\hat{f}$) is adjusted by −kf. In a typical application the frequency error might be sampled every 100 symbols.

In contrast to the prior art, in the present invention the outer loop 102 is not a PLL and is driven by a frequency error estimate 152 from the inner loop 104, whereas in the prior art it was driven by a phase error estimate (specifically, a phase of a timing interpolator). In the prior art, the outer loop 102 would typically not be started until the inner loop 104 has stabilized, to prevent stability issues during acquisition.

Figure 2:
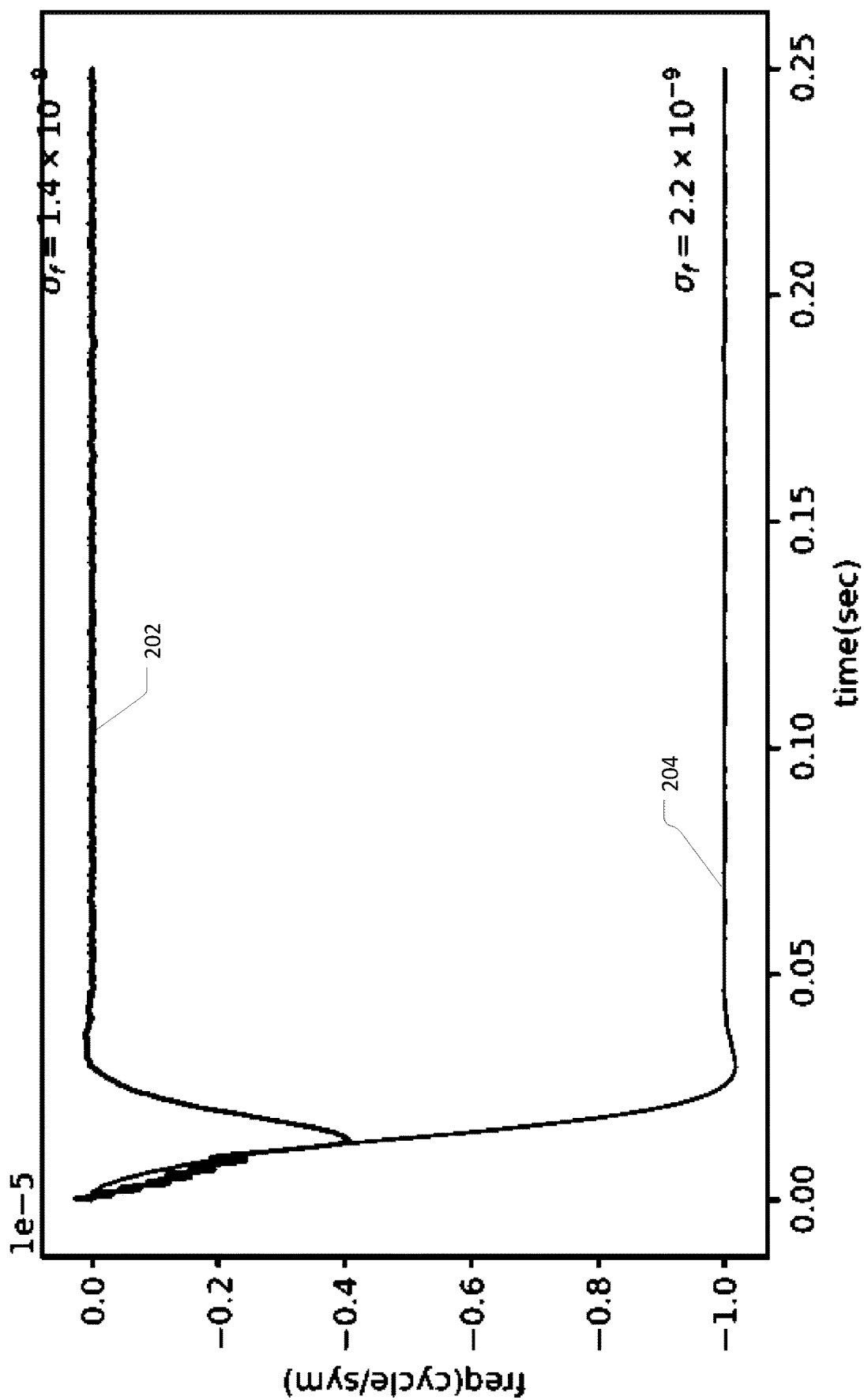
FIG. 2 illustrates an acquisition performance of the present teachings according to one embodiment.

FIG. 2 illustrates an acquisition performance of the present teachings according to one embodiment.

In FIG. 2, the initial frequency error is $1 \times 10^{-5}$ relative to the symbol rate which could be typical of a low-cost oscillator (10 ppm). The received signal to noise ratio $E_s/N_0=0$ dB might be close to worst case for a typical VSAT. Curve 202 shows the frequency error response over time of the inner loop 104. Curve 204 shows the frequency control response over time of the outer loop 102. Curve 204 is annotated with the RMS frequency error (calculated in the last ½ of the example curve) and an $\sigma_f=2.2 \times 10^{-9}$ as a relative frequency error is observed. When this reference oscillator is then multiplied to a Ka band transmit frequency 30 of GHz, the resulting carrier frequency error would be 66 Hz (1σ). This is excellent and a signal acquisition in this example is completed in about 20 ms.

Figure 3:
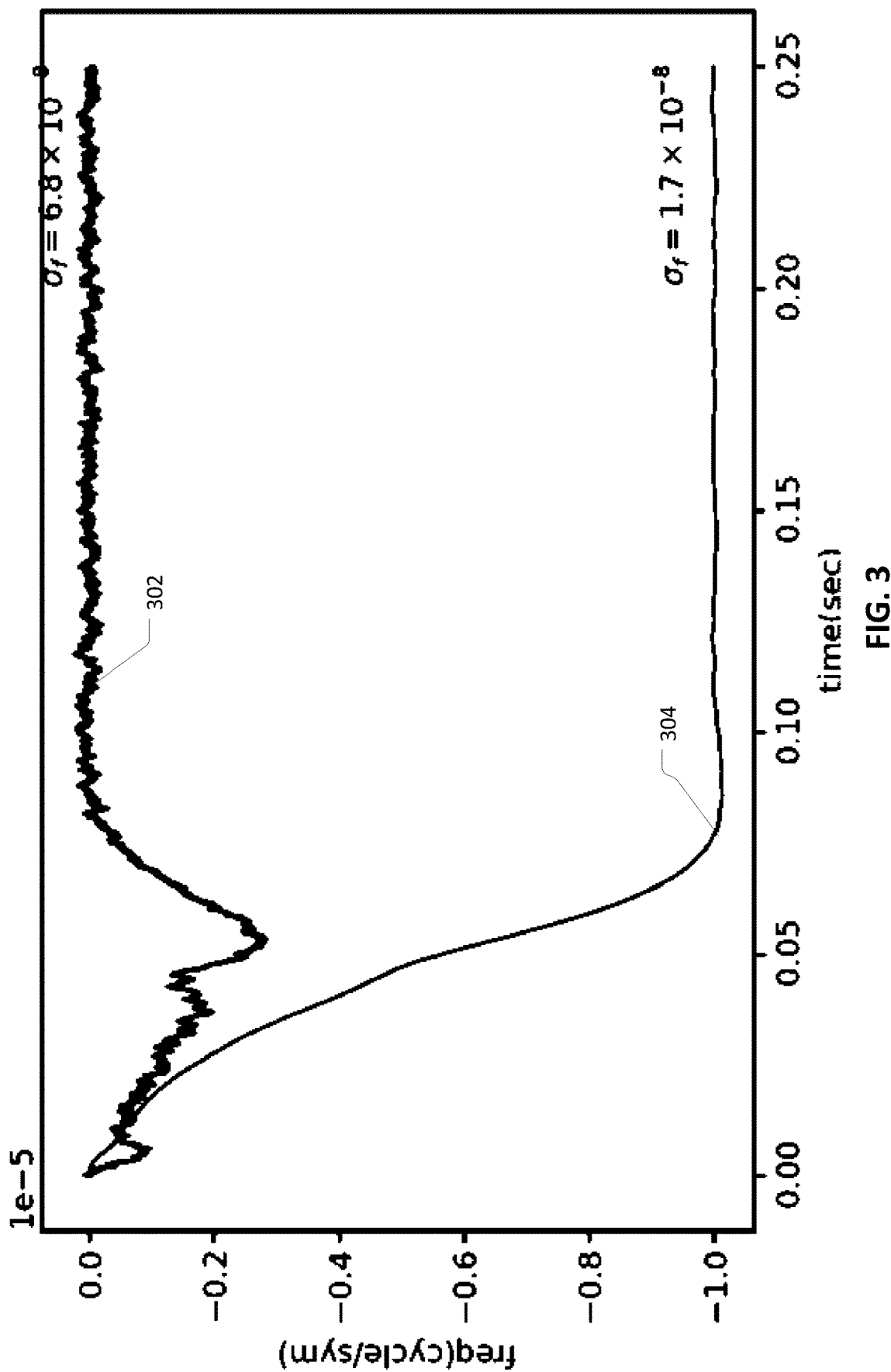
FIG. 3 illustrates an acquisition performance of the present teachings for an Internet of Things (IoT) device according to one embodiment.

FIG. 3 illustrates an acquisition performance of the present teachings for an Internet of Things (IoT) device according to one embodiment.

For an Internet-of-Things (IoT) application the ability to synchronize accurately and quickly is critical as IoT devices are often required to operate on battery power. The longer the receiver must be powered on waiting for frequency to stabilize, the more energy it will consume. Moreover, the IoT device may use a small antenna and hence the signal from the hub may be received at a low signal-to-noise ratio, which further constrains the time to acquire.

FIG. 3 illustrates signal acquisition for an IoT application having a received signal to noise ratio $E_s/N_0=-13$ dB. A frequency reference with $\sigma_f=1.7 \times 10^{-8}$, which corresponds to a frequency error of 510 Hz at 30 GHz (1σ), takes about 70 ms for acquisition in our observations. These examples of speed and accuracy depend on the choice of parameters for the inner loop 104 and outer loop 102, and can be varied to optimize acquisition for the particular application.

Figure 4:
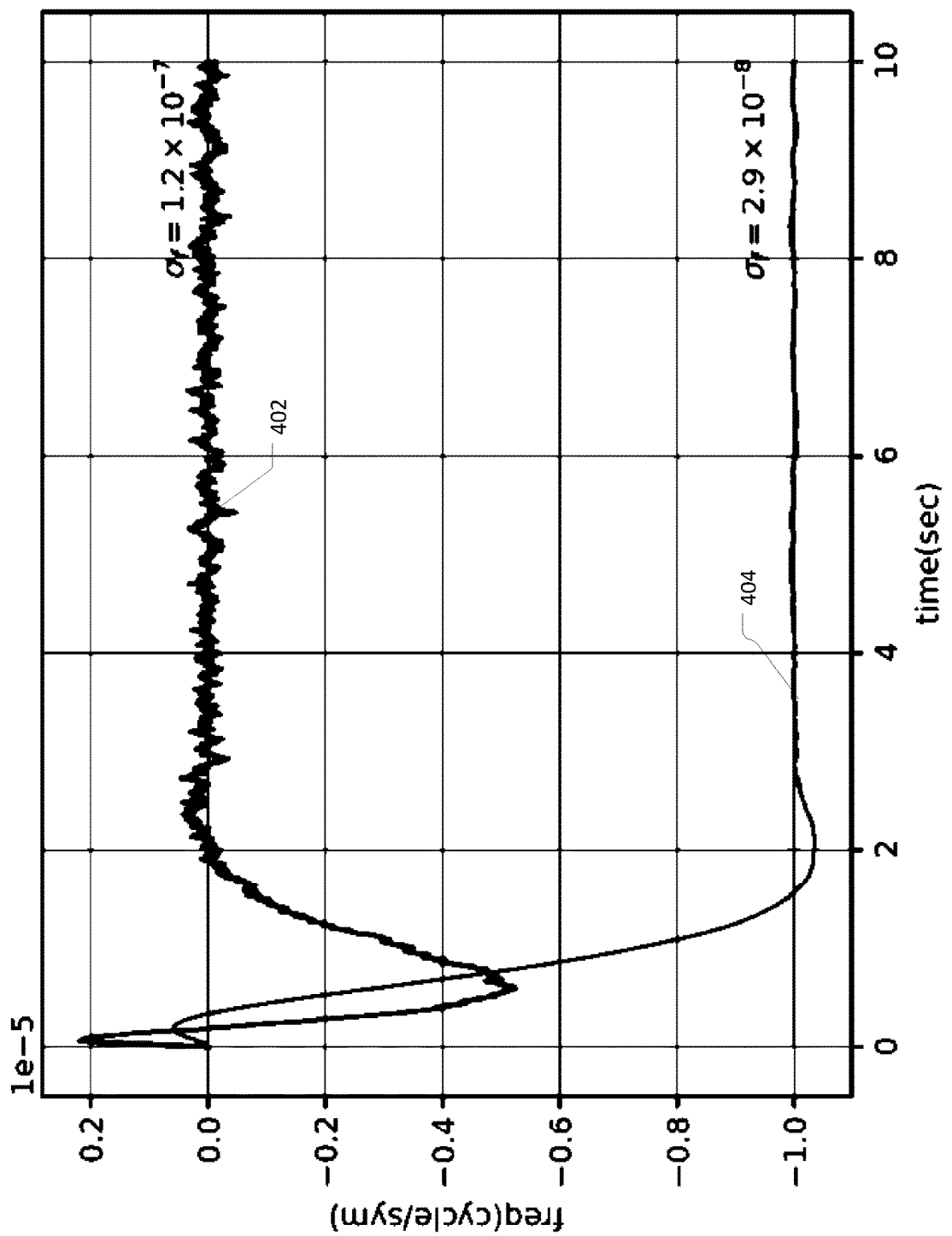
FIG. 4 illustrates acquisition at a symbol rate of $E_s/N_0=0$ dB, $R_S=1$ Msym/s according to one embodiment.

FIG. 4 illustrates acquisition at a symbol rate of $E_s/N_0=0$ dB, $R_S=1$ Msym/s according to one embodiment.

FIG. 4 illustrates that acquisition at a symbol rate of $E_s/N_0=0$ dB, $R_S=1$ Msym/s takes about 3 seconds for a frequency error of $2.9 \times 10^{-8}$ (1σ) using the present teachings. For comparison, acquisition under the same test conditions acquisition takes about 10 seconds for a frequency error of $3.3 \times 10^{-8}$ (1σ)) using a prior art implementation.

Having described preferred embodiments of a system and method (which are intended to be illustrative and not limiting), it is noted that modifications and variations can be made by persons skilled in the art considering the above teachings. It is therefore to be understood that changes may be made in the embodiments disclosed which are within the scope of the invention as outlined by the appended claims. Having thus described aspects of the invention, with the details and particularity required by the patent laws, what is claimed and desired protected by Letters Patent is set forth in the appended claims.

I claim as my invention:

1. An apparatus for synchronizing frequency to a symbol timing, the apparatus comprising:
   a master oscillator to generate a master clock signal;
   an accumulator to accumulate a frequency error estimate between a symbol timing frequency and the master clock signal; and
   a frequency controller to transfer a portion of the frequency error estimate to the master oscillator to obtain a lock between the symbol timing and the master clock signal of the master oscillator in a manner that zeros-out a frequency error,
   wherein the accumulator and the master oscillator comprise an outer loop and a negative value of a portion of the frequency error estimate is transferred to an inner loop to adjust the frequency error estimate by the negative value.

2. The apparatus of claim 1, wherein the master oscillator comprises a Voltage Controlled Crystal Oscillator (VCXO) to control a sampling of the symbol timing by an Analog-to-Digital Converter (A/D).

3. The apparatus of claim 1, wherein the master oscillator comprises a Numerically Controlled Oscillator (NCO).

4. The apparatus of claim 1, further comprising a phase lock loop comprising the inner loop comprising a second order loop, wherein an output of the second order loop controls an interpolator.

5. The apparatus of claim 4, wherein the interpolator periodically samples the symbol timing frequency with a periodicity.

6. The apparatus of claim 4, wherein the interpolator periodically samples the symbol timing frequency with a periodicity greater than 50 symbols and less than 1000 symbols.

7. The apparatus of claim 1, wherein the outer loop is driven by the frequency error estimate.

8. The apparatus of claim 1, wherein the outer loop that is started during a signal acquisition of a received signal.

9. The apparatus of claim 1, wherein the portion of the frequency error estimate transferred to the master oscillator is subtracted from the frequency error estimate.

10. The apparatus of claim 1, wherein the accumulator comprises a delay element with an adder in a feedback loop.

11. The apparatus of claim 1, wherein the accumulator comprises a delay element containing a single integrator.

12. The apparatus of claim 1, wherein the outer loop further comprises the frequency controller.

13. The apparatus of claim 1, wherein the outer loop is not a phase lock loop and the outer loop is driven by a frequency error estimate from the inner loop.

14. The apparatus of claim 1, wherein a portion of the frequency error estimate is periodically used to adjust the frequency error estimate of the outer loop.

* * * * *